(12) United States Patent
Chen et al.

(10) Patent No.: US 8,289,090 B2
(45) Date of Patent: Oct. 16, 2012

(54) AMPLITUDE CONTROL FOR OSCILLATOR

(75) Inventors: Zhiqin Chen, San Diego, CA (US);
Nam V. Dang, San Diego, CA (US);
Nan Chen, San Diego, CA (US); Thuan Ly, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 94 days.

(21) Appl. No.: 12/886,719

(22) Filed: Sep. 21, 2010

(65) Prior Publication Data

US 2012/0068774 A1 Mar. 22, 2012

(51) Int. Cl.
*H03B 5/36* (2006.01)
*H03G 1/00* (2006.01)
*H03L 5/00* (2006.01)

(52) U.S. Cl. .................................... 331/109; 331/158

(58) Field of Classification Search .................. 331/109, 331/158, 116 FE, 15, 116 R
See application file for complete search history.

(56) References Cited

U.S. PATENT DOCUMENTS

| 4,999,588 | A | 3/1991 | Koch | |
|---|---|---|---|---|
| 6,784,757 | B2 | 8/2004 | Sibrai et al. | |
| 6,798,301 | B1 | 9/2004 | Balan et al. | |
| 7,187,245 | B1 * | 3/2007 | McMenamy | 331/158 |
| 7,292,114 | B2 | 11/2007 | Greenberg | |
| 7,598,821 | B2 | 10/2009 | Novac | |
| 8,035,455 | B1 * | 10/2011 | McMenamy | 331/109 |
| 2008/0122549 | A1 | 5/2008 | Greenberg | |
| 2008/0252390 | A1 * | 10/2008 | Guerreiro | 331/116 FE |

FOREIGN PATENT DOCUMENTS

EP 1041709 A2 10/2000

OTHER PUBLICATIONS

International Search Report and Written Opinion—PCT/US2011/052635-ISA/EPO—Dec. 7, 2011.

* cited by examiner

*Primary Examiner* — Joseph Chang
(74) *Attorney, Agent, or Firm* — Sam Tapalatsky; Nicholas J. Pauley; Jonathan T. Velasco

(57) ABSTRACT

An amplitude control circuit includes a pair of peak detectors. The pair of peak detectors are responsive to a voltage reference generator. The amplitude control circuit is configured to be responsive to an oscillating signal of a crystal oscillator and configured to generate a control signal to control an amplitude of the oscillating signal.

41 Claims, 8 Drawing Sheets

AMPLITUDE CONTROL FOR OSCILLATOR

I. FIELD

The present disclosure is generally related to amplitude control for an oscillator.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Typically, portable communication devices include an oscillator to generate a clock signal. The oscillator can include a resonator such as a quartz crystal connected to amplifier circuitry. Because the oscillator may operate for long periods of time and the resulting clock signal may be used for synchronizing operation of multiple electronic components, reducing oscillator power consumption and/or reducing clock jitter due to noise tolerance may be beneficial.

III. SUMMARY

An amplitude control circuit for an oscillator compares an amplitude of a signal output by the oscillator to a reference bias and outputs a control signal to adjust the amplitude based on the comparison. The amplitude control circuit uses a first peak detector to measure the amplitude of the signal and a second peak detector to hold a value corresponding to the reference bias. The control signal provided by the amplitude control circuit can be applied control an oscillation current so that oscillation startup and low active current can be achieved across a range of process, voltage, and temperature (PVT) conditions.

In a particular embodiment, an apparatus includes an amplitude control circuit that has a pair of peak detectors that are responsive to a voltage reference generator. The amplitude control circuit is configured to be responsive to an oscillating signal of a crystal oscillator and to generate a control signal to control an amplitude of the oscillating signal.

In another particular embodiment, the apparatus includes a first transistor configured to be coupled to a crystal oscillation circuit. The apparatus also includes an amplitude control circuit configured to adaptively control an amplitude of a current to be applied to the first transistor. The amplitude control circuit includes first and second voltage peak detectors and an input coupled to receive an oscillating signal associated with the crystal oscillation circuit.

In another particular embodiment, a method includes generating a control signal to control a gain of an amplifier of an oscillator. The control signal is generated based on a comparison between a first peak voltage and a second peak voltage. The first peak voltage is detected at a first peak detector responsive to an amplitude of a signal and the second peak voltage is detected at a second peak detector responsive to a voltage reference generator.

In another particular embodiment, the method includes detecting a first peak voltage of a first reference voltage signal at a first peak detector and detecting a second peak voltage of a second reference voltage signal at a second peak detector. The first reference voltage signal and the second reference voltage signal are based on an oscillating signal associated with a crystal oscillator. The method also includes generating a control signal to adaptively control an amplitude of a current to be applied to a transistor coupled to the crystal oscillator. The control signal is generated based on the first peak voltage and the second peak voltage.

One particular advantage provided by at least one of the disclosed embodiments is reduced jitter resulting from power noise rejection due to the peak detectors having similar responses to noise occurring in a power supply, as compared to systems that do not include multiple peak detectors. Anther advantage provided by at least one of the disclosed embodiments is a low active current and low current variation across a range of process, voltage, and temperature (PVT) conditions as a result of controlling an amount of oscillator current based on a measured amplitude of an oscillator signal. Another advantage provided by at least one of the disclosed embodiments is that oscillator operation is enabled using a supply voltage of less than one volt as a result of reduced voltage headroom requirements.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

Figure 7:
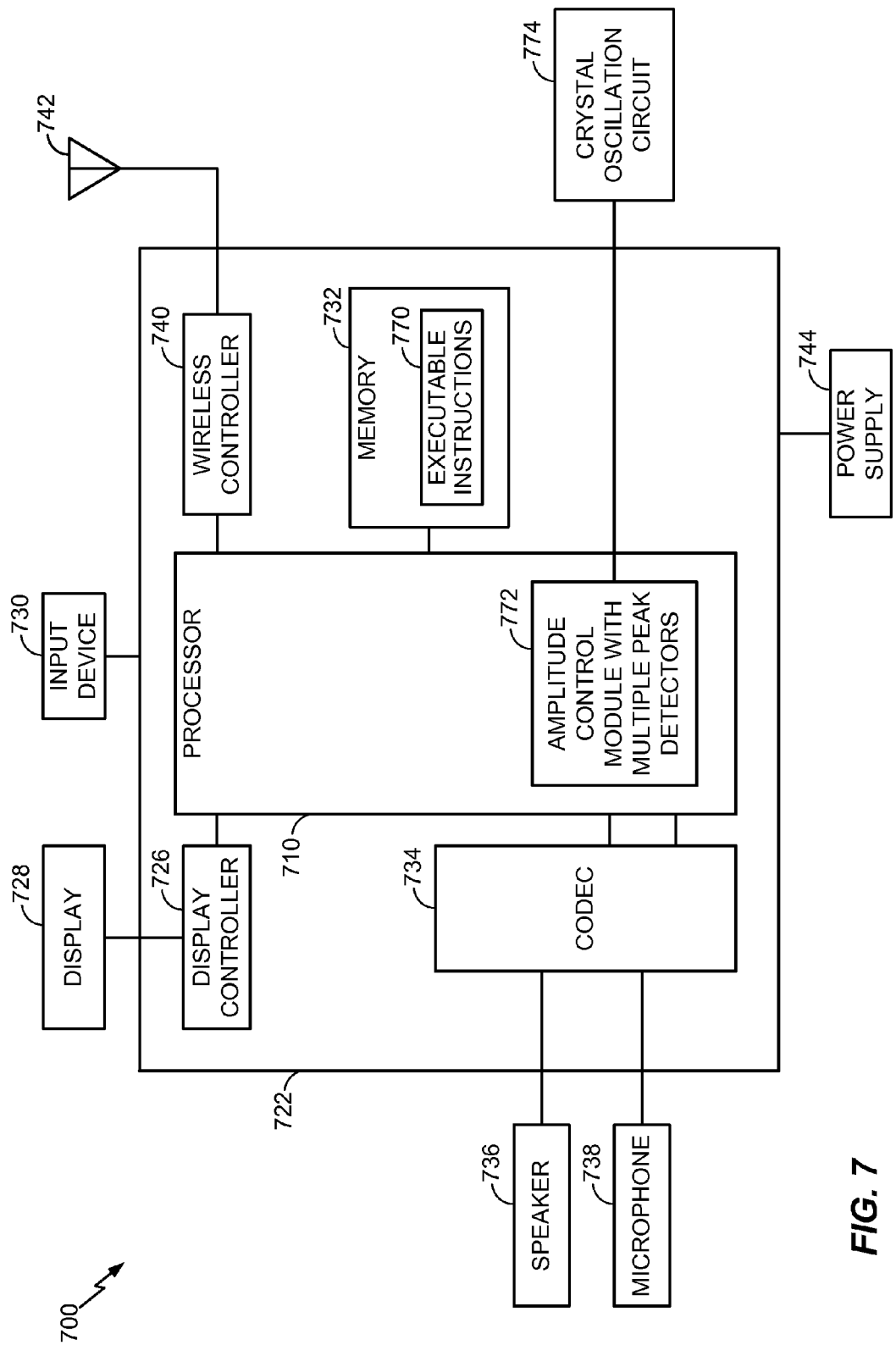
Figure 8:
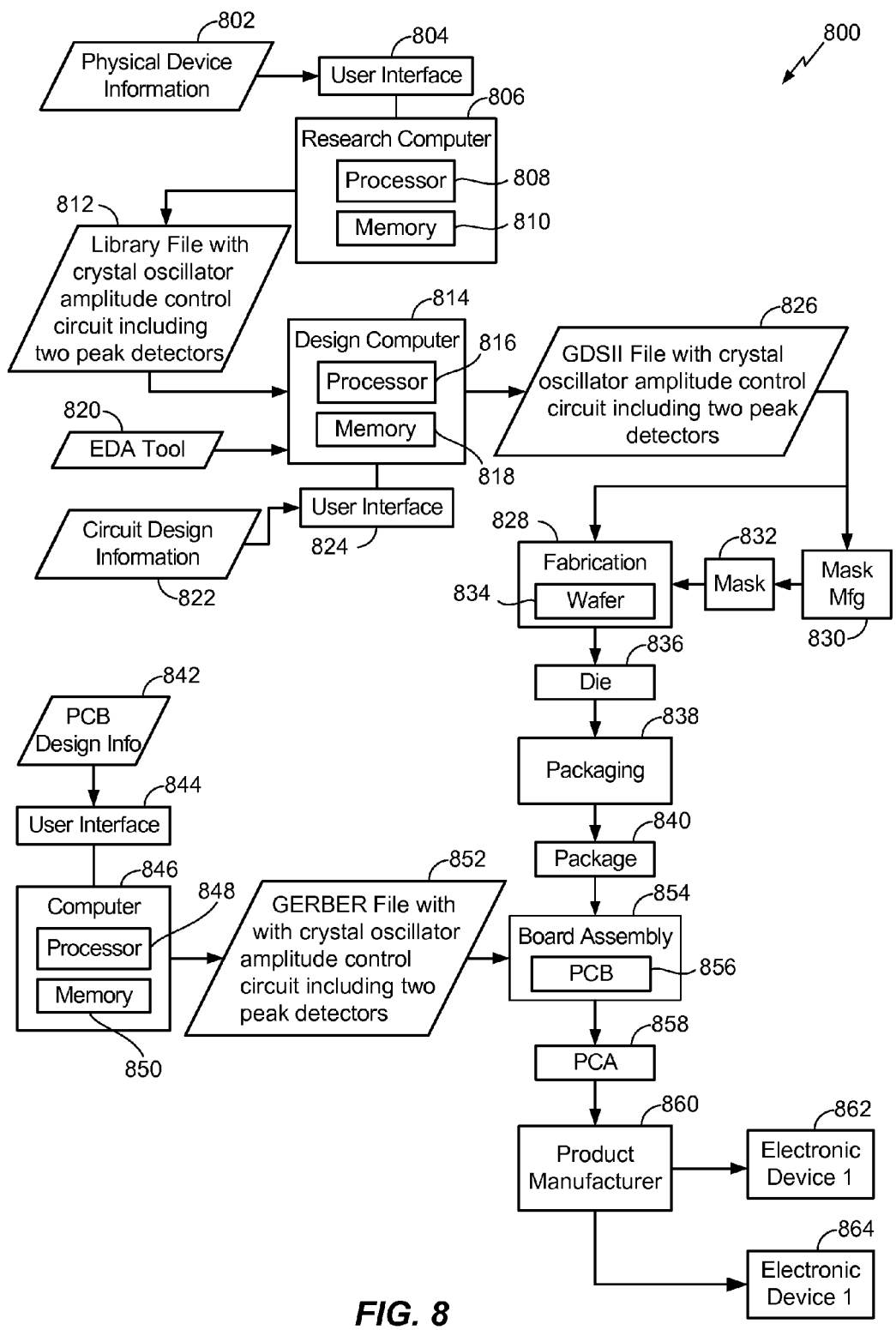

FIG. 7 is a block diagram of a portable device including an amplitude control circuit having multiple peak detectors to control an amplitude of an oscillator signal; and FIG. 8 is a data flow diagram of a particular illustrative embodiment of a manufacturing process to manufacture electronic devices that include an amplitude control circuit having two peak detectors to control an amplitude of an oscillator signal.

V. DETAILED DESCRIPTION

Figure 1:
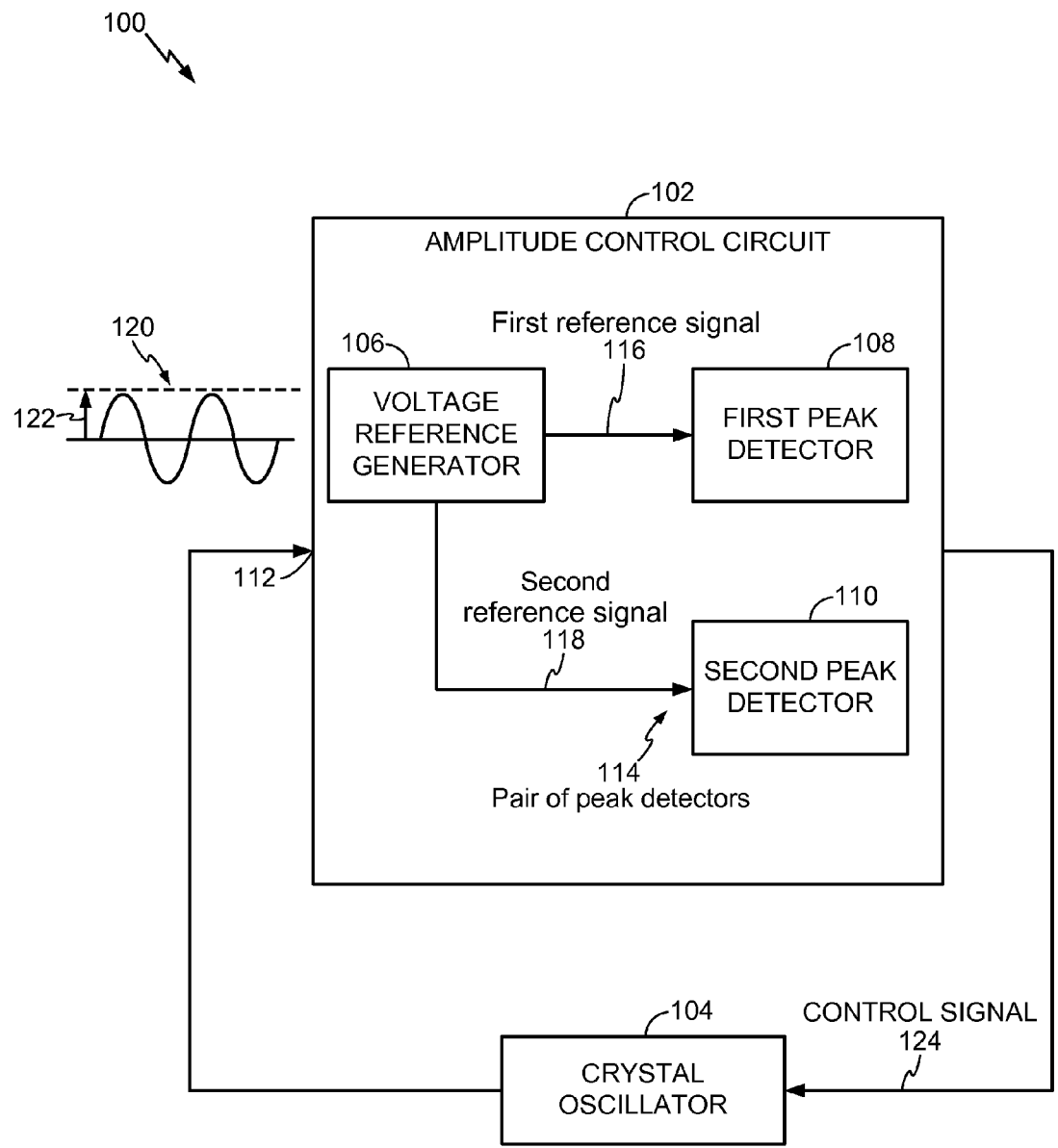
FIG. 1 is a block diagram of a first illustrative embodiment of a system including an amplitude control circuit to control an amplitude of an oscillator signal.

Referring to FIG. 1, a first illustrative embodiment of a system to control an amplitude of an oscillator signal is depicted and generally designated 100. The system 100 includes an amplitude control circuit 102 coupled to an oscillator, such as a crystal oscillator 104. The amplitude control circuit 102 includes a pair of peak detectors 114 (e.g. a first peak detector 108 and a second peak detector 110) that are responsive to a voltage reference generator 106. The amplitude control circuit 102 is responsive to an oscillating signal 120 of the crystal oscillator 104 and is configured to generate a control signal 124 to control an amplitude 122 of the oscillating signal 120. The amplitude control circuit 102 and the crystal oscillator 104 are coupled to form a feedback loop, such that the amplitude 122 of the oscillating signal 120 is responsive to the control signal 124.

The amplitude control circuit 102 includes an input 112 coupled to receive the oscillating signal 120 generated by the crystal oscillator 104. The amplitude control circuit 102 includes the voltage reference generator 106 coupled to a first peak detector 108 and a second peak detector 110 of the pair of peak detectors 114. The amplitude control circuit 102 is configured to generate the control signal 124 based on a comparison of peak values detected by the first peak detector 108 and the second peak detector 110. To illustrate, the voltage reference generator 106 may be configured to output a first reference signal (e.g. a first voltage V1) 116 to the first peak detector 108 and a second reference signal (e.g. a second voltage V2) 118 to the second peak detector 110 based on the oscillating signal 120 of the crystal oscillator 104. For example, as described in FIG. 4, the first reference signal 116 may indicate a value based on the amplitude 122 of the oscillating signal 120, while the second reference signal 118 may reflect a direct current (DC) bias voltage. The amplitude control circuit 102 may be configured to compare a first peak voltage detected at the first peak detector 108 to a second peak voltage detected at the second peak detector 110 and adjust a value of the control signal 124 based on the comparison such that the control signal 124 may change an amplitude 122 of the oscillating signal 120.

Figure 2:
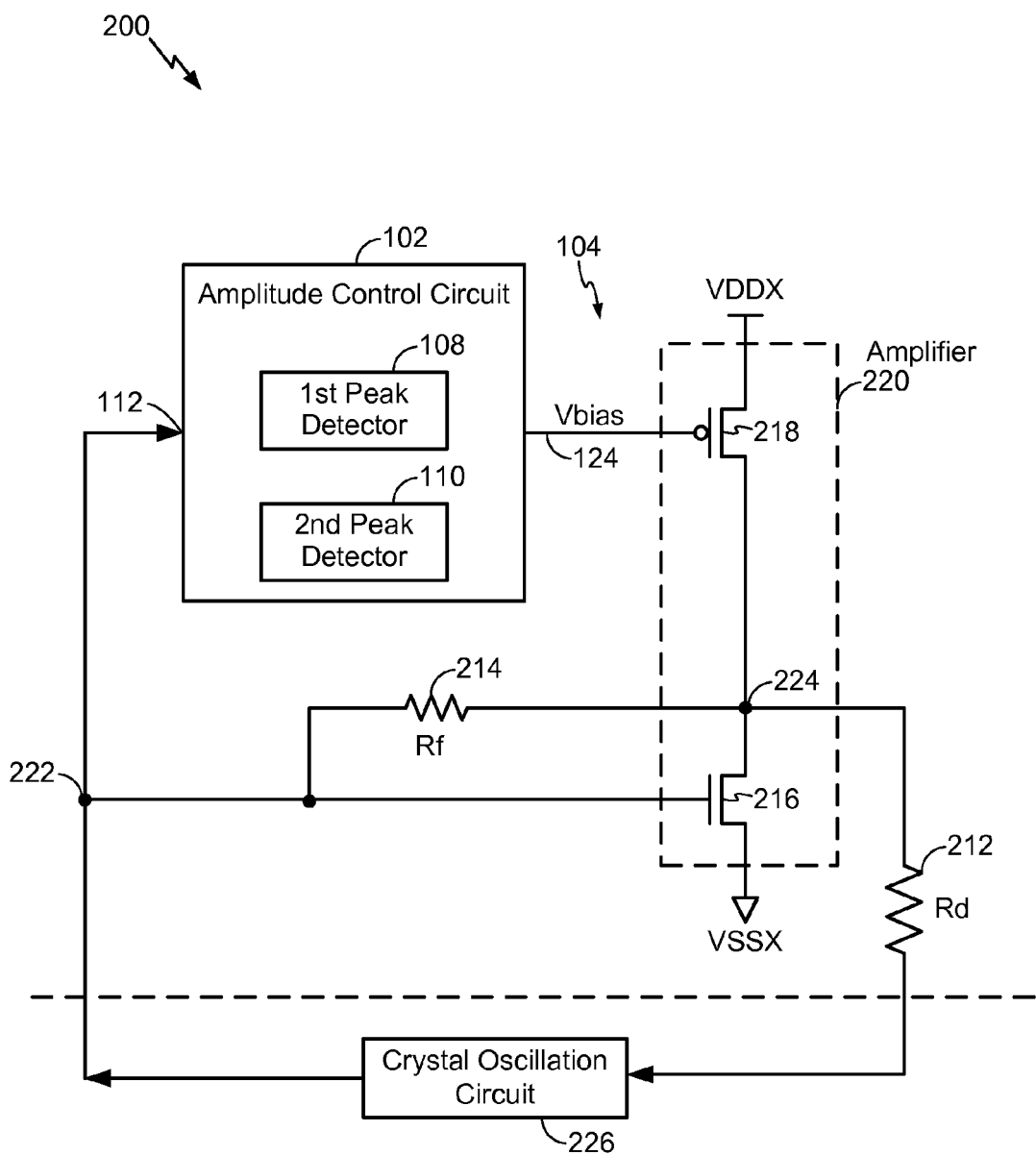
FIG. 2 is a diagram of a second illustrative embodiment of a system including an amplitude control circuit to control an amplitude of an oscillator signal.
Figure 3:
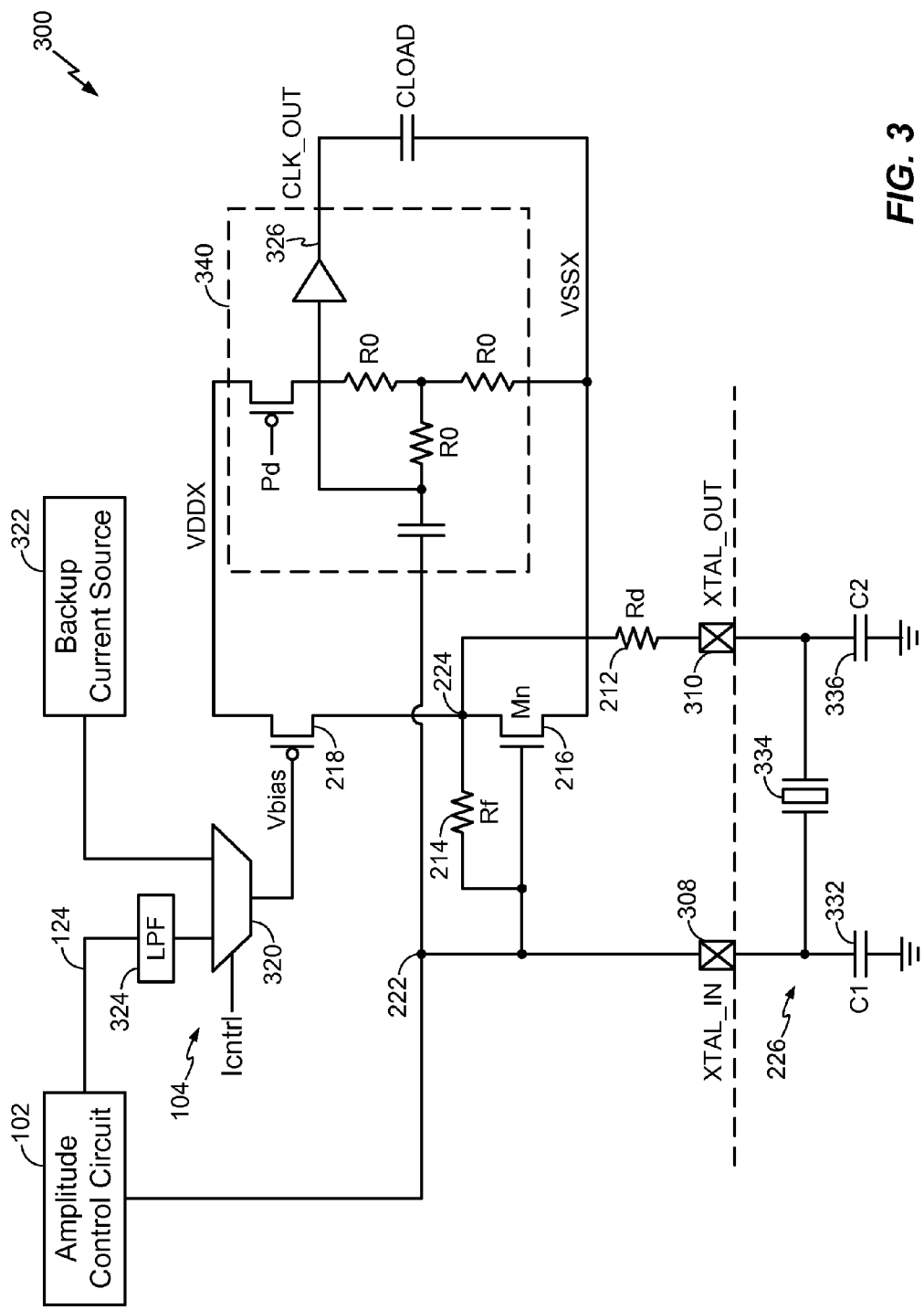
FIG. 3 is a diagram of a third illustrative embodiment of a system including an amplitude control circuit to control an amplitude of an oscillator signal.

The crystal oscillator 104 may be configured to generate an oscillating electrical signal, such as by using a crystal or other resonator coupled to an amplifier and to one or more load capacitors, as described in FIG. 3. The crystal oscillator 104 may be configured to generate a substantially continuous oscillating signal 120 having an amplitude 122 that is responsive to the control signal 124. For example, an increase in voltage of the control signal 124 may cause the oscillating signal 120 to have an increased amplitude 122, and a decrease in voltage of the control signal 124 may cause the oscillating signal 120 to have a reduced amplitude 122. For example, the control signal 124 may be provided to an amplifier of the crystal oscillator 104, as described with respect to FIG. 2.

During operation, the crystal oscillator 104 may be initialized by providing a sufficient amount of current to enable oscillation startup of the crystal oscillator 104. At startup, an initial amplitude 122 of the oscillating signal 120 received at the input 112 of the amplitude control circuit 102 may be zero or substantially close to zero (i.e. a small amplitude). In response to the small amplitude 122, the amplitude control circuit 102 may generate a value of the control signal 124 indicating a large discrepancy between a value of the first peak detector 108 and a value of the second peak detector 110. As a result, the control signal 124 may cause more current to be provided to the crystal oscillator 104, such as via an amplifier circuit responsive to the control signal 124, as described in FIGS. 2-3. The crystal oscillator 104 may respond to the control signal 124 by increasing the amplitude 122 of the oscillating signal 120. When the amplitude 122 is sufficient to cause values stored at the first peak detector 108 and the second peak detector 110 to be substantially equal, the control signal 124 may be adjusted to prevent further increase of the amplitude 122 and to maintain substantially steady operation of the crystal oscillator 104.

By controlling an amount of current assessable to the crystal oscillator 104 via the control signal 124 based on the amplitude 122 of the oscillating signal 120 generated by the crystal oscillator 104, the amplitude control circuit 102 facilitates oscillation startup and manages a desired amount of active current. The desired amount of current may be set at a lower level to save power. For example, conventional architectures may use large devices to ensure sufficient current for oscillator startup for use in a required range of process, voltage and temperature variation. As a result, operation of such conventional architectures at nominal values of process, voltage, and temperature may have a high static current due to direct-current (DC) self-biasing. By adjusting the control signal 124 to control the amplitude 122, an amount of current provided to the crystal oscillator 104 may be regulated to permit sufficient current for oscillator startup and to control and limit DC static current.

FIG. 2 illustrates a system 200 that includes the amplitude control circuit 102 and provides an illustrative example of components of the crystal oscillator 104 of FIG. 1. The crystal oscillator 104 includes an amplifier 220 having a pair of transistors including a first transistor 216 and a second transistor 218. The first transistor 216 is responsive to a first node 222 and is coupled to the second transistor 218 via a second node 224. A damping resistor Rd 212 is coupled between the second node 224 and an input to a crystal oscillation circuit 226. An output of the crystal oscillation circuit 226 is coupled to the amplitude control circuit 102 via the first node 222. A feedback resistor Rf 214 is coupled between the first node 222 and the second node 224. The amplitude control circuit 102 is configured to adaptively control an amplitude of a current to be applied to the first transistor 216. By adaptively controlling the amplitude of the current to be applied to the first transistor 216, an amplitude of an input signal to the crystal oscillation circuit 226 may be controlled.

The amplitude control circuit 102 includes the first peak detector 108 and the second peak detector 110. The amplitude control circuit 102 is responsive to an output of the crystal oscillation circuit 226 at the first node 222. The amplitude control circuit 102 is configured to generate the control signal Vbias 124 based on a comparison of a voltage detected at the first peak detector 108 and a voltage detected at the second peak detector 110. In a particular embodiment, each of the first peak detector 108 and the second peak detector 110 includes an operational amplifier that is coupled to a capacitor and configured to selectively charge the capacitor when a received voltage exceeds a voltage at the capacitor, as described with respect to FIG. 4.

In a particular embodiment, the control signal Vbias 124 is provided to a gate of the second transistor 218. As illustrated, the second transistor 218 may be a p-type transistor, such as a p-type metal-oxide-semiconductor (PMOS) transistor that is coupled between a voltage supply VDDX and the second node 224. An amount of current flow between the voltage supply VDDX and the second node 224 is controllable via the control signal (also referred to as Vbias) 124 provided at the gate of the second transistor 218. The first transistor 216 is coupled between the second node 224 and a second voltage supply VSSX (e.g. a ground). The first transistor 216 has a gate that is coupled to the first node 222. A drain of the first transistor 216 is coupled to the gate of the first transistor 216 via the feedback resistor Rf 214 and to an input of the crystal oscillation circuit 226 via the damping resistor Rd 212. The first transistor 216 may be an n-type transistor, such as an n-type metal-oxide-semiconductor (NMOS) transistor.

During operation, the amplitude control circuit 102 adaptively controls an amplitude of a current to be applied to the first transistor 216. The amplitude control circuit 102 receives at the input 112 an oscillating signal output from the crystal oscillation circuit 226 via the first node 222. The first voltage peak detector 108 generates a first peak voltage based on the input 112 and the second voltage peak detector 110 generates a second peak voltage. The amplitude control circuit 102 generates the control signal Vbias 124 that depends on the first peak voltage and the second peak voltage. The control signal 124 is applied to a gate of the second transistor 218 and determines an amount of current accessible to the first transistor 216, thereby affecting an amplitude of the oscillating signal output by the crystal oscillation circuit 226. The oscillating signal at the first node 222 may be used to generate an output clock signal, as described with respect to FIG. 3.

In other embodiments, one or more additional components may be implemented to reduce output clock jitter due to jitter at the first node 222. For example, the control signal Vbias 124 may be filtered via a low pass filter (LPF) between the amplitude control circuit 102 and the second transistor 218 to reduce noise, as described with respect to FIG. 3. As another example, one or more additional stages of signal amplifiers may be added to sharpen the oscillating signal provided by the crystal oscillation circuit 226 so that inverter trip point shifting due to power noise will not add clock jitter.

Because the current provided to the crystal oscillator 104 is determined by the control signal 124, oscillator operation may be enabled using reduced voltage and smaller devices as compared to conventional designs. For example, the first transistor 216 may have a width between approximately 100 microns and approximately 700 microns. The system 200 may operate with a voltage supply of less than approximately 1 volt (e.g. VDDX<1 V, VSSX=0 V) and in a particular embodiment may operate with a voltage supply of approximately 0.94 volts. Low voltage operation may be enabled by controlling the second transistor 218 via the control signal 124, reducing a voltage headroom requirement of a conventional inverter configuration. To illustrate, in a conventional Pierce oscillator architecture having an NMOS and a PMOS in an inverter configuration, to ensure oscillation startup, the loop gain must exceed unity, expressed as:

$$gm_T = gm_n + gm_p > \frac{ESR}{x_1^2}$$

where $gm_T$ is the total transconductance of the gain stage, $gm_n$ and $gm_p$, are transconductances of the inverter NMOS and PMOS, respectively, $x_1$ is the reactance of a load capacitor, and ESR is the equivalent series resistance of the crystal. Because $$gm_n \approx gm_p = \mu C_{OX} \frac{W}{L} \left( \frac{V_{DD}}{2} - V_t \right)$$

(where $\mu$ is carrier mobility, $C_{OX}$ is oxide capacitance, W is channel width, L is channel length, $V_{DD}$ is supply voltage, and $V_t$ is threshold voltage), the Pierce oscillator architecture requires large transistors to ensure sufficient $gm_T$ at a low voltage and temperature condition, such as 0.94 V, −30° C. condition. In addition, large variation of active current arises in the Pierce oscillator architecture because active current is proportional to $$\left( \frac{V_{DD}}{2} - V_t \right)^2.$$

In contrast to the Pierce oscillator architecture, the first transistor 216 has adequate voltage head room so that a sufficient transconductance for oscillation startup can be provided without requiring the large transistor sizes of the Pierce oscillator architecture, with $gm_n$ of the first transistor 216 expressed as:

$$gm_n = \mu C_{ox} \frac{W}{L} (V_{gs} - V_t) = \frac{2 I_d}{(V_{gs} - V_t)} = \sqrt{2 \mu C_{ox} \frac{W}{L} I_d}$$

where $V_{gs}$ is the gate-to-source voltage and $I_d$ is the drain current.

The gain stage current bias may be determined by the amplitude control feedback loop through the second transistor 218. The feedback resistor Rf 214 biases the first transistor 216 in a saturation operation region for amplifying the signal from the crystal oscillation circuit 226, at the first node 222. The feedback resistor Rf 214 may have a smaller resistance than feedback resistors used in conventional oscillator architectures, resulting in lower thermal noise. For example, the feedback resistor Rf 214 may have a resistance of approximately one hundred thousand ohms (100 kΩ), while a conventional Pierce oscillator configuration may have a feedback resistance of one million ohms (1 MΩ) or more.

FIG. 3 illustrates a system 300 that includes the amplitude control circuit 102 and provides another illustrative example of components of the crystal oscillator 104 of FIG. 1. The amplitude control circuit 102 is coupled to a first input of a multiplexer 320 via a low pass filter (LPF) 324 that is configured to filter out noise. A backup current source 322 is coupled to a second input of the multiplexer 320. The multiplexer 320 receives a control signal (lcntrl) at a control input to enable selection of the filtered control signal 124 or a signal from the backup current source 322. The selected input signal is provided as the output signal (Vbias) of the multiplexer 320 to the gate of the second transistor 218.

The first transistor 216 has a gate coupled to the first node 222 and has a drain that is coupled to the first node 222 via the feedback resistor Rf 214. The drain of the first transistor 216 is also coupled to a drain of the second transistor 218 via the second node 224.

A crystal output (XTAL_OUT) pin 310 is coupled to the second node 224 via the damping resistor Rd 212. A crystal input (XTAL_IN) pin 308 is coupled to the first node 222, which is coupled to an input of the amplitude control circuit 102. The crystal oscillation circuit 226 includes a resonator 334, such as a piezoelectric resonator or a ceramic resonator, coupled between the crystal input pin 308 and the crystal output pin 310. In addition, a first load capacitor C1 332 is coupled between the crystal input pin 308 and ground, and a second load capacitor C2 336 is coupled between the crystal output pin 310 and ground.

The oscillating signal at the first node 222 is processed to provide a clock output signal (CLK_OUT) 326 via an output circuit 340. The output circuit 340 includes a capacitor coupled to a resistor divider to set a DC bias of the oscillating signal. The biased oscillating signal is provided to an input of an output buffer that provides the clock output signal 326 to a load (illustrated as a load capacitor CLOAD).

The amplitude control circuit 102, the first transistor 216, and the second transistor 218 may be integrated into a semiconductor device (e.g. a die or packaged die) and coupled to the external crystal oscillation circuit 226 (i.e. not on the semiconductor device) via the crystal input pin 308 and the crystal output pin 310. Although illustrated as pins 308, 310, in other embodiments the amplitude control circuit 102 and the first transistor 216 may be coupled to an external resonator via one or more wires, nodes, access ports, or other couplings.

During operation, the control input (lcntrl) of the multiplexer 320 may be set to provide the filtered control signal 124 from the amplitude control circuit 102 to the gate of the second transistor 218. The second transistor 218 controls an amplitude of a current to be applied to the first transistor 216, thereby affecting an amplitude of the oscillating signal output by the crystal oscillation circuit 226. The amplitude control circuit 102 receives an oscillating signal output from the crystal oscillation circuit 226 via the first node 222 and generates the control signal 124 based on the amplitude of received the oscillating signal. The oscillating signal at the first node 222 is DC-biased at the output circuit 340 and provided to the output buffer to generate the clock output signal 326.

Figure 4:
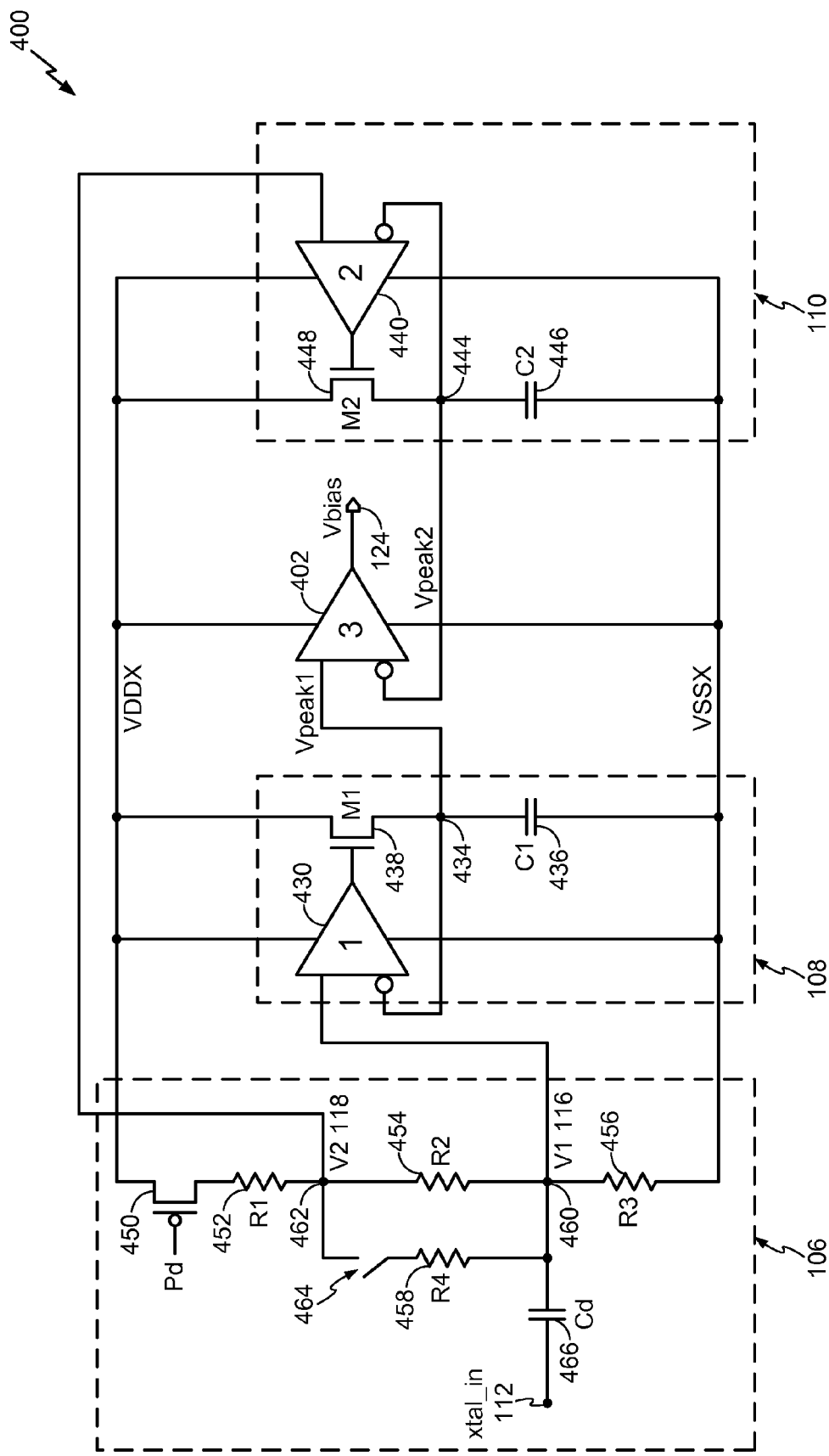
FIG. 4 is a circuit diagram of a particular illustrative embodiment of an amplitude control circuit that can be used in the systems of FIGS. 1-3.
Figure 5:
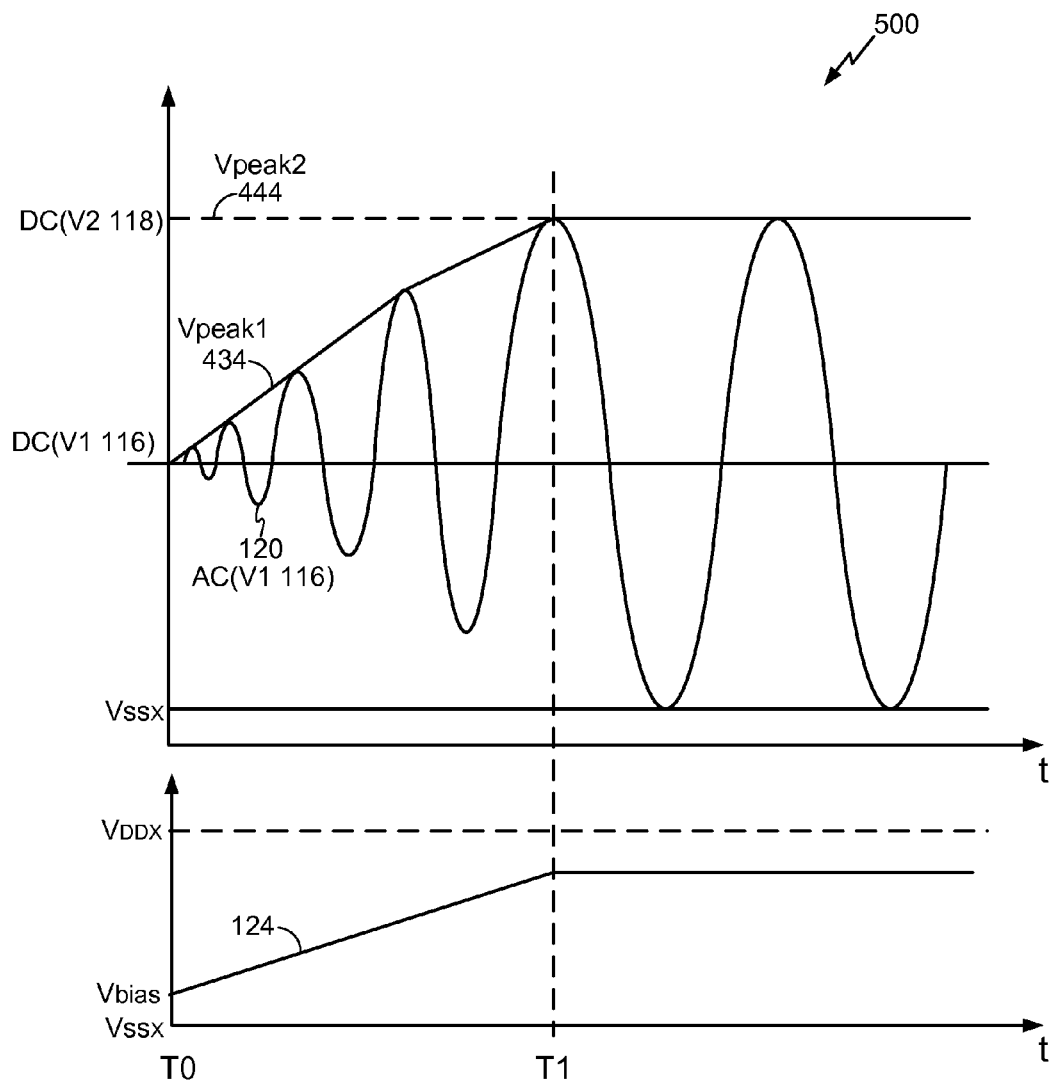
FIG. 5 is a timing diagram depicting an illustrative embodiment of operation of the amplitude control circuit of FIG. 4.

Referring to FIG. 4, an illustrative embodiment 400 of the amplitude control circuit 102 of FIG. 1 depicts the first peak detector 108 including a first operational amplifier (op-amp) 430 and the second peak detector 110 including a second op-amp 440. The amplitude control circuit includes the voltage reference generator 106 and a third operational amplifier 402 to define an oscillation amplitude. The voltage reference generator 106 is coupled to the first peak detector 108 and to the second peak detector 110. Outputs of the first peak detector 108 and the second peak detector 110 are provided to inputs the third op-amp 402. An output of the third op-amp 402 provides the control signal (Vbias) 124. A timing diagram illustrating operation of the circuit 400 during oscillation startup is depicted in FIG. 5.

In a particular embodiment, the voltage reference generator 106 includes an isolation device 450 serially coupled to a plurality of resistors configured to generate a reference voltage output, such as a resistor divider between the first voltage supply VDDX and the second voltage supply VSSX. The resistor divider includes a first resistor 452 having resistance R1 serially coupled to a second resistor 454 having resistance R2 via a second reference node 462. The second resistor 454 is coupled to a third resistor 456 (resistance R3) via a first reference node 460. The third resistor 456 is coupled to the second voltage supply VSSX. A fourth resistor 458 having resistance R4 may be coupled in parallel to the second resistor 454 between the second reference node 462 and the first reference node 460 and may be selectively electrically coupled to, or isolated from, the resistor divider via a switch 464.

The voltage reference generator 106 includes a coupling capacitor 466 that is configured to pass an alternating current (AC) component of the oscillating signal to the first reference node 460 while blocking a DC component of the oscillating signal received at the input 112.

In a particular embodiment, the first peak detector 108 includes a comparison device, such as the first op-amp 430. The first op-amp 430 has a non-inverting input coupled to receive the first reference signal V1 116 from the first reference node 460. An output of the first op-amp 430 is provided to a gate of a first transistor M1 438. The first transistor M1 438 is coupled to a first capacitor C1 436 via a first peak node 434. A voltage Vpeak1 at the first peak node 434 is provided to an inverting input of the first op-amp 430 and is further provided to a non-inverting input of the third op-amp 402.

In a particular embodiment, the second peak voltage detector 110 includes the second op-amp 440 having a non-inverting input coupled to the second reference node 462 to receive the second reference voltage V2 118. The second op-amp 440 generates an output that is provided to a second transistor M2 448. The second transistor M2 448 is coupled between the first voltage supply VDDX and a second peak node 444. A second capacitor C2 446 is coupled between the second peak node 444 and the second voltage supply VSSX. The second peak node 444 is coupled to provide a voltage Vpeak2 to an inverting input of the second op-amp 440 and to an inverting input of the third op-amp 402.

During operation, an oscillating crystal signal is received at the input (xtal_in) 112 and an AC component is passed through the capacitor Cd 466 to the first reference node 460. At startup, an amplitude of the AC component of the oscillating signal may be small and the reference voltages V1 116 and V2 118 may be primarily determined via the resistor divider 452-456. The isolation device 450 is controlled to enable a current flow between the first voltage supply VDDX and the second voltage supply VSSX via the first resistor 452, the second resistor 454, and the third resistor 456 (and optionally the fourth resistor 458), resulting in the first voltage V1 116 at the first reference node 460 and the second voltage V2 118 at the second reference node 462.

The voltage reference generator 106 may bias V1 116 and V2 118 according to a setting of the switch 464. In a first setting where the switch 464 is closed, V1 116 may be biased at 0.46*VDD to set the peak-to-peak amplitude of signal at the input 112 to 0.4*VDD:

$$V1 = \frac{R3}{(R1 + R2 // R4 + R3)} * VDD = 0.46 * VDD$$

$$V2 = \frac{(R2 // R4 + R3)}{(R1 + R2 // R4 + R3)} * VDD = 0.66 * VDD$$

In a second setting where the switch 464 is open, V1 116 may be biased at 0.4*VDD to set the peak-to-peak amplitude of a signal at the input 112 to 0.6*VDD:

$$V1 = \frac{R3}{(R1 + R2 + R3)} * VDD = 0.4 * VDD$$

$$V2 = \frac{(R2 + R3)}{(R1 + R2 + R3)} * VDD = 0.6 * VDD$$

The first bias voltage V1 116 is provided to the first op-amp 430 and the second reference voltage V2 118 is provided to the second op-amp 440. Each of the first op-amp 430 and the second op-amp 440 generates a respective output based on a comparison of the reference voltage received at the non-inverting input to a voltage of the initially discharged capacitor 436 or 446 coupled to the inverting input. As a result, the first op-amp 430 turns on the transistor 438 to charge the capacitor C1 436 and the second op-amp 440 turns on the transistor 448 to charge the capacitor C2 446. The capacitor C2 446 is charged such that the second peak node 444 generally corresponds to a DC bias at the second reference node 462, approximately equal to the second reference voltage V2 118. Similarly, the first capacitor C1 436 is charged so that a voltage of the first peak node 434 is approximately equal to a voltage of the first reference node 460, V1 116. Voltages Vpeak1 and Vpeak2 are received at the non-inverting and the inverting inputs of the third op-amp 402, respectively, and cause the third op-amp 402 to generate the control signal Vbias 124 having a voltage that initially causes an increase in amplitude of the received oscillating signal.

As the amplitude of the received oscillating signal at the input 112 increases, an AC component of the voltage V1 116 increases. As a peak value of the AC component is added to the DC bias component at the first reference node 460, the first op-amp 430 determines that V1 116 exceeds the voltage Vpeak1 of the first peak node 434, activating the transistor M1 438 to further charge C1 436 and increase Vpeak1. In this manner, Vpeak1 continues to increase, although remaining lower in magnitude than Vpeak2. The third op-amp 402 adjusts the control signal 124 based on comparing Vpeak1 and Vpeak2, and the resulting control signal 124 continues to cause an increase of the amplitude of the oscillating signal received at the input 112. When the oscillating signal received at the input 112 has an amplitude of an AC component that is equal to the DC bias difference between the second reference node 462 and the first reference node 460, Vpeak1 at the first peak node 434 and Vpeak2 at the second peak node 444 may be substantially equal, and the third op-amp 402 may set a value of the control signal Vbias 124 to prevent further increase of the amplitude of the oscillating signal received at the input 112. In the event that a peak amplitude of the oscillating signal received at the input 112 exceeds the DC voltage difference between the second reference node 462 and the first reference node 460, the third op-amp 402 may adjust the control signal Vbias 124 to a value indicating that Vpeak1 exceeds Vpeak2, causing the crystal oscillator 104 to reduce the amplitude of the oscillating signal.

Because the peak detectors 108, 110 may be implemented using matching components (e.g. substantially similar op-amps 430 and 440), Vpeak1 and Vpeak2 can track each other to improve power noise rejection and reduce clock jitter. For example, in a particular embodiment having a fifty millivolt (50 mV) peak-to-peak power supply noise and a fifty millivolt (50 mV) peak-to-peak ground noise, a reduction in jitter by a factor of two can be obtained as compared to a Pierce oscillator architecture. By defining the ratios between R1, R2, R3, and R4, the oscillation signal can be well controlled. Setting the oscillation amplitude enables the gain stage current of the crystal oscillator 104 to be reduced by the feedback loop to reduce power while also enabling oscillation.

FIG. 5 depicts a simplified illustration of operation of the circuit 400 of FIG. 4. The diagram 500 includes a first set of traces including the oscillating signal 120, a DC component of the voltage V1 116 at the first reference node 460, a DC component of the second reference voltage V2 118 at the second reference node 462, and the second supply voltage VSSX as a function of time. A second set of traces includes the control signal Vbias 124, the first supply voltage VDDX, and the second supply voltage VSSX. The oscillating signal 120 is illustrated as an AC component of V1 116 that initially has a near zero amplitude at an initial time T0. The control signal Vbias 124 assumes an initial value at time T0, corresponding to Vpeak1 434 having a lower amplitude than Vpeak2 444 at time T0.

After the initial time T0, the amplitude of the oscillating signal 120 increases in response to an initial value of the control signal Vbias 124. Similarly, the voltage at the first peak node 434, Vpeak1, increases according to the increase of amplitude of the input signal 120 as a result of peak detection of the oscillating signal 120. The control signal Vbias 124 adjusts as the oscillating signal 120 increases in amplitude, and the voltage Vpeak1 434 approaches the voltage Vpeak2 444.

The amplitude of the oscillating signal 120 and Vpeak1 434 increase until Vpeak1 is approximately equal to Vpeak2 444 at time T1. At time T1, because Vpeak1 434 and Vpeak2 444 are substantially equal, a value of the control signal Vbias 124 remains at a substantially constant voltage level to hold an amplitude of the oscillating signal 120 at a substantially constant, steady-state value.

Although FIG. 5 illustrates smoothly transitioning, noise-free traces for ease of explanation and clarity of illustration, during implementation one or more of the illustrated traces may not be smoothly varying and may be subject to noise or other effects. For example, Vpeak1 434 may not increase smoothly and may instead increase in a step-wise manner with each peak of the oscillating signal 120. As another example, the control signal Vbias 124 may overshoot a steady-state value at T1 as a result of a delay of the peak detectors 108, 110, causing an oscillatory or damped oscillatory behavior of the control signal 124 and the amplitude 122 of the oscillating signal 120 after time T1.

Figure 6:
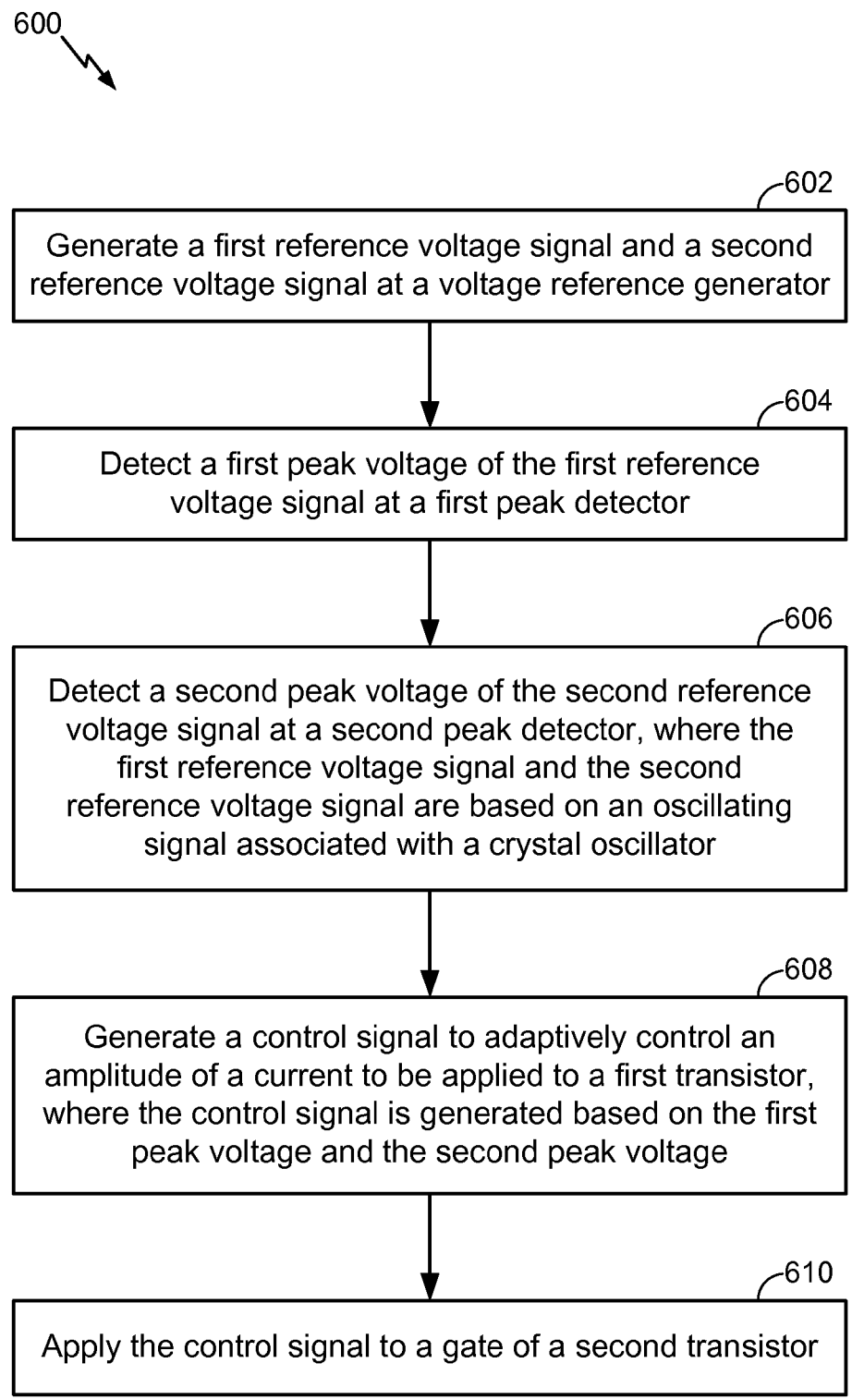
FIG. 6 is a flow chart of a particular illustrative embodiment of a method of controlling an amplitude of an oscillator signal.

FIG. 6 depicts a particular embodiment of a method 600 of amplitude control for an oscillator. In an illustrative embodiment, the method 600 may be performed by the amplitude control circuit 102 of FIG. 1. A first reference voltage signal and a second reference voltage signal may be generated at a voltage reference generator, at 602.

A first peak voltage of a first reference voltage signal may be detected at a first peak detector, at 604. A second peak voltage of a second reference voltage signal may be detected at a second peak detector, at 606. The first reference voltage signal and the second reference voltage signal may be based on an oscillating signal associated with a crystal oscillator. For example, the first reference voltage V1 116 may have an AC component corresponding to an AC component of the oscillating signal, and the second reference voltage V2 118 may be set to define a peak-to-peak amplitude of the oscillating signal based on a difference between V2 118 and a DC bias of V1 116, as illustrated in FIG. 4.

A control signal is generated to adaptively control an amplitude of a current to be applied to a first transistor that is coupled to a crystal oscillator, at 608. The control signal may be generated based on the first peak voltage and the second peak voltage. For example, the control signal 124 may be generated by the third op-amp 402 based on a comparison between Vpeak1 of the first peak detector 108 and Vpeak2 of the second peak detector 110.

The control signal may be applied to a gate of a second transistor that is serially coupled to the first transistor, at 610. For example, the control signal 124 may be applied to the gate of the second transistor 218 of FIG. 2 that is serially coupled to the first transistor 216 of FIG. 2.

The method 600 may be implemented by a field-programmable gate array (FPGA) device, an application-specific integrated circuit (ASIC), a processing unit such as a central processing unit (CPU), a digital signal processor (DSP), a controller, another hardware device, firmware, or any combination thereof. As an example, the method of FIG. 6 can be performed by a computer or a processor that executes instructions, as described with respect to FIG. 7.

Referring to FIG. 7, a block diagram of a particular illustrative embodiment of a wireless communication device is depicted and generally designated 700. The device 700 includes a processor 710, such as an application processor or digital signal processor (DSP), coupled to a memory 732. An amplitude control module with multiple peak detectors 772 is integrated in the processor 710 and coupled to a crystal oscillation circuit 774. In an illustrative embodiment, the amplitude control module with multiple peak detectors 772 may be the amplitude control circuit 102 of FIG. 1, the circuit 400 of FIG. 4, may operate according to the method of FIG. 6, or any combination thereof.

The amplitude control circuit 772 may include dedicated circuitry that includes multiple peak detectors and that is configured to provide an amplitude control signal based on a comparison of a reference voltage with a peak voltage that is associated with a received signal amplitude. In addition, or alternatively, at least a portion of the amplitude control module 772 may be implemented by the processor 710 executing instructions. For example, the memory 732 may be a non-transient computer readable tangible medium storing executable instructions 770 that are executable by a computer to generate a control signal to control a gain of an amplifier of an oscillator. For example, the processor 710 may execute the executable instructions 770 to generate the control signal based on a comparison between a first peak voltage and a second peak voltage. The first peak voltage can be detected at a first peak detector responsive to an amplitude of a signal received from the crystal oscillation circuit 774 and the second peak voltage can be detected at a second peak detector responsive to a voltage reference generator.

FIG. 7 also shows a display controller 726 that is coupled to the processor 710 and to a display 728. A coder/decoder (CODEC) 734 can also be coupled to the processor 710. A speaker 736 and a microphone 738 can be coupled to the CODEC 734.

FIG. 7 also indicates that a wireless controller 740 can be coupled to the processor 710 and to a wireless antenna 742. In a particular embodiment, the processor 710, the display controller 726, the memory 732, the CODEC 734, and the wireless controller 740 are included in a system-in-package or system-on-chip device 722. In a particular embodiment, an input device 730 and a power supply 744 are coupled to the system-on-chip device 722. Moreover, in a particular embodiment, as illustrated in FIG. 7, the crystal oscillation circuit 774, the display 728, the input device 730, the speaker 736, the microphone 738, the wireless antenna 742, and the power supply 744 are external to the system-on-chip device 722. However, each of the crystal oscillation circuit 774, the display 728, the input device 730, the speaker 736, the microphone 738, the wireless antenna 742, and the power supply 744 can be coupled to a component of the system-on-chip device 722, such as via an interface or a controller.

In conjunction with the disclosed embodiments, an apparatus to control an amplitude of an oscillator can include means for amplifying an oscillating signal of a crystal oscillation circuit. For example the means for amplifying the oscillating signal can include the first transistor 216 of FIGS. 2-3, such as an NMOS transistor biased in a saturation region by the feedback transistor Rf 214 of FIGS. 2-3, one or more types of transistors, buffers, amplifiers, or other circuitry configured to amplify the oscillating signal, or any combination thereof. The apparatus can also include means for adaptively controlling an amplitude of a current to be applied to the means for amplifying. For example the means for adaptively controlling the amplitude may be the amplitude control circuit 102 of FIGS. 1-3 or the circuit 400 of FIG. 4. The means for adaptively controlling the amplitude can include means for detecting a first peak voltage corresponding to the oscillating signal, such as the first peak detector 108 of FIGS. 1-4 or another type of peak detector circuit. The means for adaptively controlling the amplitude can also include means for detecting a second peak voltage corresponding to a reference voltage, such as the first peak detector 108 of FIGS. 1-4 or another type of peak detector circuit.

The means for adaptively controlling the amplitude may include means for generating the reference voltage, such as the voltage reference generator 106 of FIGS. 1-4, one or more other types of voltage dividers, or one or more other types of reference generation circuits such as digital-to-analog (D/A) converters, sample-and-hold circuits, or any other type of circuit configured to generate a voltage value. The means for adaptively controlling the amplitude can include means for generating a control signal based on a comparison between the first peak voltage and the second peak voltage, such as the third op-amp 402 of FIG. 4 or any other comparator, adder, or other circuit device adapted to generate an output based on a comparison of two input values.

A method of operation can include generating a control signal to control a gain of an amplifier of an oscillator. The control signal is generated based on a comparison between a first peak voltage and a second peak voltage. The first peak voltage is detected at a first peak detector responsive to an amplitude of a signal and the second peak voltage is detected at a second peak detector responsive to a voltage reference generator.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 8 depicts a particular illustrative embodiment of an electronic device manufacturing process 800.

Physical device information 802 is received at the manufacturing process 800, such as at a research computer 806. The physical device information 802 may include design information representing at least one physical property of a semiconductor device, such as the amplitude control circuit 102 of FIG. 1, the systems of FIG. 2-3, the circuit 400 of FIG. 4, or any combination thereof. For example, the physical device information 802 may include physical parameters, material characteristics, and structure information that is entered via a user interface 804 coupled to the research computer 806. The research computer 806 includes a processor 808, such as one or more processing cores, coupled to a computer readable medium such as a memory 810. The memory 810 may store computer readable instructions that are executable to cause the processor 808 to transform the physical device information 802 to comply with a file format and to generate a library file 812.

In a particular embodiment, the library file 812 includes at least one data file including the transformed design information. For example, the library file 812 may include a library of semiconductor devices including a device that includes the amplitude control circuit 102 of FIG. 1, the systems of FIG. 2-3, the circuit 400 of FIG. 4, or any combination thereof, that is provided to use with an electronic design automation (EDA) tool 820.

The library file 812 may be used in conjunction with the EDA tool 820 at a design computer 814 including a processor 816, such as one or more processing cores, coupled to a memory 818. The EDA tool 820 may be stored as processor executable instructions at the memory 818 to enable a user of the design computer 814 to design a circuit including the amplitude control circuit 102 of FIG. 1, the systems of FIG. 2-3, the circuit 400 of FIG. 4, or any combination thereof, of the library file 812. For example, a user of the design computer 814 may enter circuit design information 822 via a user interface 824 coupled to the design computer 814. The circuit design information 822 may include design information representing at least one physical property of a semiconductor device, such as amplitude control circuit 102 of FIG. 1, the systems of FIG. 2-3, the circuit 400 of FIG. 4, or any combination thereof. To illustrate, the circuit design property may include identification of particular circuits and relationships to other elements in a circuit design, positioning information, feature size information, interconnection information, or other information representing a physical property of a semiconductor device.

The design computer 814 may be configured to transform the design information, including the circuit design information 822, to comply with a file format. To illustrate, the file formation may include a database binary file format representing planar geometric shapes, text labels, and other information about a circuit layout in a hierarchical format, such as a Graphic Data System (GDSII) file format. The design computer 814 may be configured to generate a data file including the transformed design information, such as a GDSII file 826 that includes information describing the amplitude control circuit 102 of FIG. 1, the systems of FIG. 2-3, the circuit 400 of FIG. 4, or any combination thereof, in addition to other circuits or information. To illustrate, the data file may include information corresponding to a system-on-chip (SOC) that includes the amplitude control circuit 102 of FIG. 1, the systems of FIG. 2-3, the circuit 400 of FIG. 4, and that also includes additional electronic circuits and components within the SOC.

The GDSII file 826 may be received at a fabrication process 828 to manufacture the amplitude control circuit 102 of FIG. 1, the systems of FIG. 2-3, the circuit 400 of FIG. 4, or any combination thereof, according to transformed information in the GDSII file 826. For example, a device manufacture process may include providing the GDSII file 826 to a mask manufacturer 830 to create one or more masks, such as masks to be used with photolithography processing, illustrated as a representative mask 832. The mask 832 may be used during the fabrication process to generate one or more wafers 834, which may be tested and separated into dies, such as a representative die 836. The die 836 includes a circuit including a device that includes the amplitude control circuit 102 of FIG. 1, the systems of FIG. 2-3, the circuit 400 of FIG. 4, or any combination thereof.

The die 836 may be provided to a packaging process 838 where the die 836 is incorporated into a representative package 840. For example, the package 840 may include the single die 836 or multiple dies, such as a system-in-package (SiP) arrangement. The package 840 may be configured to conform to one or more standards or specifications, such as Joint Electron Device Engineering Council (JEDEC) standards.

Information regarding the package 840 may be distributed to various product designers, such as via a component library stored at a computer 846. The computer 846 may include a processor 848, such as one or more processing cores, coupled to a memory 850. A printed circuit board (PCB) tool may be stored as processor executable instructions at the memory 850 to process PCB design information 842 received from a user of the computer 846 via a user interface 844. The PCB design information 842 may include physical positioning information of a packaged semiconductor device on a circuit board, the packaged semiconductor device corresponding to the package 840 including the amplitude control circuit 102 of FIG. 1, the systems of FIG. 2-3, the circuit 400 of FIG. 4, or any combination thereof.

The computer 846 may be configured to transform the PCB design information 842 to generate a data file, such as a GERBER file 852 with data that includes physical positioning information of a packaged semiconductor device on a circuit board, as well as layout of electrical connections such as traces and vias, where the packaged semiconductor device corresponds to the package 840 including the amplitude control circuit 102 of FIG. 1, the systems of FIG. 2-3, the circuit 400 of FIG. 4, or any combination thereof. In other embodiments, the data file generated by the transformed PCB design information may have a format other than a GERBER format.

The GERBER file 852 may be received at a board assembly process 854 and used to create PCBs, such as a representative PCB 856, manufactured in accordance with the design information stored within the GERBER file 852. For example, the GERBER file 852 may be uploaded to one or more machines to perform various steps of a PCB production process. The PCB 856 may be populated with electronic components including the package 840 to form a representative printed circuit assembly (PCA) 858.

The PCA 858 may be received at a product manufacture process 860 and integrated into one or more electronic devices, such as a first representative electronic device 862 and a second representative electronic device 864. As an illustrative, non-limiting example, the first representative electronic device 862, the second representative electronic device 864, or both, may be selected from the group of a set top box, a music player, a video player, an entertainment unit, a navigation device, a communications device, a personal digital assistant (PDA), a fixed location data unit, and a computer, into which the amplitude control circuit 102 of FIG. 1, the systems of FIG. 2-3, or the circuit 400 of FIG. 4 is integrated. As another illustrative, non-limiting example, one or more of the electronic devices 862 and 864 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 8 illustrates remote units according to teachings of the disclosure, the disclosure is not limited to these exemplary illustrated units. Embodiments of the disclosure may be suitably employed in any device which includes active integrated circuitry including memory and on-chip circuitry.

A device that includes the amplitude control circuit 102 of FIG. 1, the systems of FIG. 2-3, the circuit 400 of FIG. 4, or any combination thereof, may be fabricated, processed, and incorporated into an electronic device, as described in the illustrative process 800. One or more aspects of the embodiments disclosed with respect to FIGS. 1-7 may be included at various processing stages, such as within the library file 812, the GDSII file 826, and the GERBER file 852, as well as stored at the memory 810 of the research computer 806, the memory 818 of the design computer 814, the memory 850 of the computer 846, the memory of one or more other computers or processors (not shown) used at the various stages, such as at the board assembly process 854, and also incorporated into one or more other physical embodiments such as the mask 832, the die 836, the package 840, the PCA 858, other products such as prototype circuits or devices (not shown), or any combination thereof. Although various representative stages of production from a physical device design to a final product are depicted, in other embodiments fewer stages may be used or additional stages may be included. Similarly, the process 800 may be performed by a single entity or by one or more entities performing various stages of the process 800.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
an amplitude control circuit comprising a pair of peak detectors and a comparison circuit, the pair of peak detectors responsive to a voltage reference generator,
wherein the amplitude control circuit is configured to be responsive to an oscillating signal of a crystal oscillator and configured to generate a control signal to control an amplitude of the oscillating signal,
wherein the voltage reference generator is configured to output a first signal to a first peak detector of the pair of leak detectors and wherein the voltage reference generator is further configured to output a second signal to a second peak detector of the pair of peak detectors,
wherein the first signal corresponds to the oscillating signal offset by a first bias voltage and the second signal corresponds to a reference voltage, and
wherein the comparison circuit is responsive to a first input voltage that substantially matches a first peak voltage of the first signal.

2. The apparatus of claim 1, further comprising:
an amplifier including a first transistor serially coupled to a second transistor, wherein the control signal is applied to a gate of the second transistor.

3. The apparatus of claim 2, further comprising:
a low pass filter configured to filter the control signal, wherein the filtered control signal is applied to the gate of the second transistor.

4. The apparatus of claim 1, wherein the comparison circuit is further responsive to a second input voltage that substantially matches a second peak voltage of the second signal.

5. The apparatus of claim 1, wherein the first signal and the second signal are based on values of a plurality of resistors at the voltage reference generator.

6. The apparatus of claim 1 integrated in at least one semiconductor die.

7. The apparatus of claim 1, further comprising a device selected from the group consisting of a set top box, a music player, a video player, an entertainment unit, a navigation device, a communications device, a personal digital assistant (PDA), a fixed location data unit, and a computer, into which the amplitude control circuit is integrated.

8. A method, comprising:
generating a control signal to control a gain of an amplifier of an oscillator, wherein the control signal is generated based on a comparison between a first voltage that substantially matches a first peak voltage and a second voltage that substantially matches a second peak voltage; and
wherein the first peak voltage is detected at a first peak detector responsive to an amplitude of a signal offset by a first bias voltage and wherein the second peak voltage is detected at a second peak detector responsive to a voltage reference generator.

9. The method of claim 8, wherein the amplifier includes a first transistor serially coupled to a second transistor, and wherein the control signal is applied to a gate of the second transistor.

10. The method of claim 9, wherein the first transistor is an n-type metal-oxide-semiconductor (NMOS) transistor and the second transistor is a p-type metal-oxide-semiconductor (PMOS) transistor.

11. The method of claim 10, wherein a width of the NMOS transistor is between approximately 100 microns and approximately 700 microns.

12. The method of claim 8, wherein the oscillator operates with a voltage supply of less than approximately 1 volt.

13. The method of claim 8, wherein generating the control signal is performed at a processor integrated into an electronic device.

14. An apparatus comprising:
a first transistor configured to be coupled to a crystal oscillation circuit; and
an amplitude control circuit configured to adaptively control a magnitude of a current to be applied to the first transistor, the amplitude control circuit comprising:
a first voltage peak detector responsive to a first signal, the first signal corresponding to an oscillating signal offset by a first bias voltage, the oscillating signal associated with the crystal oscillation circuit;
a second voltage peak detector, the second voltage peak detector responsive to a second signal, the second signal corresponding to a reference voltage; and
a comparison circuit, the comparison circuit responsive to a first input voltage that substantially matches a first peak voltage of the first signal.

15. The apparatus of claim 14, wherein the amplitude control circuit includes a voltage reference generator and an operational amplifier to define an oscillation amplitude.

16. The apparatus of claim 14, wherein the comparison circuit is further responsive to a second input voltage that substantially matches a second peak voltage of the second signal.

17. The apparatus of claim 15, wherein the oscillation amplitude is based on values of a plurality of resistors configured to generate a voltage reference output.

18. The apparatus of claim 14, wherein the amplitude control circuit is configured, to generate a control signal to be applied to a second transistor that is coupled to the first transistor.

19. The apparatus of claim 18, further comprising:
a low pass filter configured to filter the control signal.

20. The apparatus of claim 14 integrated in at least one semiconductor die.

21. The apparatus of claim 14, further comprising a device selected from the group consisting of a set top box, a music player, a video player, an entertainment unit, a, navigation device, a communications device, a personal digital assistant (PDA), a fixed location data unit, and a computer, into which the amplitude control circuit is integrated.

22. A method, comprising:
detecting a first peak voltage of a first reference voltage signal offset by a first bias voltage at a first peak detector, herein the first reference voltage signal corresponds to an oscillating signal associated with a crystal oscillator;
detecting a second peak voltage of a second reference voltage signal at a second peak detector, wherein the second reference voltage signal corresponds to a reference voltage;
generating a control signal to adaptively control a magnitude of a current to be applied to a first transistor, wherein the control signal is generated by a comparison circuit; and
wherein the comparison circuit is responsive to a first input voltage that substantially matches the first peak voltage.

23. The method of claim 22, further comprising:
generating the first reference voltage signal and the second reference voltage signal a voltage reference generator.

24. The method of claim 22, further comprising:
applying the control signal to a gate of a second transistor that is serially coupled to the first transistor.

25. The method of claim 22, wherein generating the control signal is performed at a processor integrated into an electronic device.

26. An apparatus comprising:
means for amplifying an oscillating signal of a crystal oscillation circuit; and
means for adaptively controlling a magnitude of a current to be applied to the means for amplifying, the means for adaptively controlling the magnitude comprising:
means for detecting a first peak voltage corresponding to the oscillating signal offset by a first bias voltage;
means for detecting a second peak voltage corresponding to a reference voltage; and
means for comparing a first comparison input and a second comparison input, wherein the first comparison input substantially matches the first peak voltage.

27. The apparatus of claim 26, wherein the means for adaptively controlling the magnitude comprises means for generating the reference voltage.

28. The apparatus of claim 26, wherein the means for adaptively controlling the magnitude further comprises means for generating a control signal based on a comparison between the first comparison input and the second comparison input, the second comparison input substantially matching the second peak voltage.

29. The apparatus of claim 26 integrated in at least one semiconductor die.

30. The apparatus of claim 26, further comprising a device selected from the group consisting of a set top box, a music player, a video player, an entertainment unit, a navigation device, a communications device, a personal digital assistant (PDA), a fixed location data unit, and a computer, into which the means for adaptively controlling the magnitude is integrated.

31. A method comprising:
a step for detecting a first peak voltage of a first reference voltage signal offset by a first bias voltage at a first peak detector, wherein the first reference voltage signal corresponds to an oscillating signal associated with a crystal oscillator;
a step for detecting a second peak voltage of a second reference voltage signal at a second peak detector, wherein the second reference voltage signal corresponds to a reference voltage; and
a step for generating a control signal to adaptively control a magnitude of a current to be applied to a first transistor, wherein the control signal is generated based on a comparison circuit, wherein the comparison circuit is responsive to a first comparison input and a second comparison input, wherein the first comparison input substantially matches the first peak voltage, and wherein the second comparison substantially matches the second peak voltage.

32. The method of claim 31, further comprising:
a step for generating the first reference voltage signal and the second reference voltage signal at a voltage reference generator.

33. The method of claim 31, further comprising:
a step for applying the control signal to a gate of a second transistor that is serially coupled to the first transistor.

34. The method of claim 31, wherein the step for generating the contr signal is performed by a processor integrated into an electronic device.

35. A non-transient computer readable tangible medium storing instructions executable by a computer, the instructions comprising:
instructions that are executable by the computer to generate a control signal to control a gain of an amplifier of an oscillator, wherein the control signal is generated by a comparison circuit, wherein the comparison circuit is responsive to a first comparison input and a second comparison input, wherein the first comparison input substantially matches a first peak voltage, wherein the second comparison input substantially matches a second peak voltage, wherein the first peak voltage is detected at a first peak detector responsive to an amplitude of a signal of the oscillator offset by a first bias voltage, and wherein the second peak voltage is detected at a second peak detector responsive to a voltage reference generator.

36. The non-transient computer readable tangible medium of claim 35, wherein the amplifier includes a first transistor serially coupled to a second transistor, and wherein the control signal is applied to a gate of the second transistor.

37. The non-transient computer readable tangible medium of claim 36, wherein the first transistor is an n-type metal-oxide-semiconductor (NMOS) transistor and the second transistor is a p-type metal-oxide-semiconductor (PMOS) transistor.

38. The non-transient computer readable tangible medium of claim 35, wherein the instructions are executable by a processor integrated in a device selected from the group consisting of a set top box, a music player, a video player, an entertainment unit, a navigation device, a communications device, a personal digital assistant (PDA), a fixed location data unit, and a computer.

39. A method comprising:
receiving a data file comprising design information corresponding to a semiconductor device; and
fabricating the semiconductor device according to the design information, wherein the semiconductor device comprises:
a first transistor configured to be coupled to a crystal oscillation circuit; and
an amplitude control circuit configured to adaptively control a magnitude of a current to be applied to the first transistor, wherein the amplitude control circuit comprises:
first and second voltage peak detectors;
a comparison circuit;
an input to receive an oscillating signal associated with the crystal oscillation circuit, and
wherein the first voltage peak detector is responsive to a first signal and the second peak voltage detector is responsive to a second signal,
wherein the first signal corresponds to the oscillating signal offset by a first bias voltage and the second signal corresponds to a reference voltage, and
wherein the comparison circuit is responsive to a first input voltage that substantially matches a first peak voltage of the first signal.

40. The method of claim 39, wherein the data file has a GDSII format.

41. The method of claim 39, wherein the data file has a GERBER format.

* * * * *